US010304926B2

(12) United States Patent
Zhou

(10) Patent No.: US 10,304,926 B2
(45) Date of Patent: May 28, 2019

(54) TOP-DOWN METHOD FOR FABRICATING NANOWIRE DEVICE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Ming Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/662,242

(22) Filed: Jul. 27, 2017

(65) Prior Publication Data
US 2018/0097060 A1 Apr. 5, 2018

(30) Foreign Application Priority Data

Sep. 30, 2016 (CN) .......................... 2016 1 0871299

(51) Int. Cl.
H01L 29/66 (2006.01)
H01L 29/06 (2006.01)
(Continued)

(52) U.S. Cl.
CPC .......... H01L 29/0673 (2013.01); B82Y 10/00 (2013.01); B82Y 40/00 (2013.01);
(Continued)

(58) Field of Classification Search
CPC .......... H01L 29/0673; H01L 29/42392; H01L 29/78696; H01L 21/02603; H01L 29/775;
(Continued)

(56) References Cited

U.S. PATENT DOCUMENTS 7,663,166 B2 * 2/2010 Kim ..................... H01L 29/0657
257/288
8,778,768 B1 7/2014 Chang et al.
(Continued)

OTHER PUBLICATIONS

European Application No. 17192411.1, Extended European Search Report dated Feb. 15, 2018, 9 pages.

Primary Examiner — Michael M Trinh
(74) Attorney, Agent, or Firm — Kilpatrick Townsend & Stockton LLP

(57) ABSTRACT

A method for manufacturing a semiconductor device includes providing a semiconductor substrate, performing an etch process on the semiconductor substrate to form a fin and a trench on opposite sides of the fin, forming an etch guide layer filling the trench, performing an etch process on the etch guide layer to expose a first portion of the fin, and selectively etching the exposed first portion of the fin to remove a portion of the exposed portion of the fin adjacent to an upper first surface of the etch guide layer to form a first nanowire. The method further includes repeating the etch process and the selectively etching process to sequentially form second and third nanowires, and forming a gate structure surrounding the nanowire. The first, second, and third nanowires are formed in the direction perpendicular to the semiconductor substrate.

16 Claims, 12 Drawing Sheets

(51) Int. Cl.
  *H01L 21/02*     (2006.01)
  *H01L 21/3065*   (2006.01)
  *H01L 21/308*    (2006.01)
  *H01L 21/324*    (2006.01)
  *H01L 21/67*     (2006.01)
  *H01L 29/08*     (2006.01)
  *H01L 29/423*    (2006.01)
  *H01L 29/78*     (2006.01)
  *H01L 29/786*    (2006.01)
  *B82Y 10/00*     (2011.01)
  *B82Y 40/00*     (2011.01)
  *H01L 29/40*     (2006.01)
  *H01L 29/775*    (2006.01)

(52) U.S. Cl.
  CPC .... *H01L 21/02164* (2013.01); *H01L 21/3065* (2013.01); *H01L 21/3081* (2013.01); *H01L 21/3086* (2013.01); *H01L 21/3247* (2013.01); *H01L 21/67069* (2013.01); *H01L 29/0847* (2013.01); *H01L 29/401* (2013.01); *H01L 29/42376* (2013.01); *H01L 29/42392* (2013.01); *H01L 29/66439* (2013.01); *H01L 29/66742* (2013.01); *H01L 29/66795* (2013.01); *H01L 29/775* (2013.01); *H01L 29/785* (2013.01); *H01L 29/786* (2013.01)

(58) Field of Classification Search
  CPC ............. H01L 29/785; H01L 29/66439; H01L 29/401; H01L 29/66795; H01L 29/42376; H01L 21/3065
  See application file for complete search history.

(56) References Cited

U.S. PATENT DOCUMENTS

| | | |
|---|---|---|
| 9,425,293 B1 | 8/2016 | Balakrishnan et al. |
| 2010/0072445 A1* | 3/2010 | Schricker ............... B82Y 10/00 257/2 |
| 2012/0199812 A1* | 8/2012 | Baykan ............. H01L 31/03527 257/13 |
| 2014/0048773 A1* | 2/2014 | Chang ................... B82Y 10/00 257/27 |
| 2015/0228480 A1* | 8/2015 | Yin ........................ H01L 29/00 438/283 |
| 2015/0372115 A1 | 12/2015 | Koh et al. |
| 2016/0079394 A1 | 3/2016 | Li et al. |

* cited by examiner

TOP-DOWN METHOD FOR FABRICATING NANOWIRE DEVICE

CROSS-REFERENCES TO RELATED APPLICATIONS

This application claims priority to Chinese patent application No. 201610871299.7, filed with the State Intellectual Property Office of People's Republic of China on Sep. 30, 2016, the content of which is incorporated herein by reference in its entirety.

FIELD OF THE INVENTION

The present invention relates to semiconductor technology, and more particularly to a semiconductor device having a plurality of nanowires disposed along a vertical direction on a substrate and the method of forming the same.

BACKGROUND OF THE INVENTION

A metal oxide semiconductor field effect transistor (MOSFET) device has strong gate control capability and the ability to suppress short channel effects. MOSFET devices are thus considered to be most promising candidates for future development. CMOS technology has been widely used in silicon on insulator (SOI), silicon substrate for cylindrical gate nanowire MOSFET devices.

Currently, during the formation of the nanowire device, the material under the nanowire needs to be etched away. In conventional methods, this requires an isotropic etching process. But such an etching process makes it difficult to obtain good gate shape, such as flat gate morphology. It is especially difficult to maintain a good interface between the nanowire and the gate, which can impact the gate characteristics, and degrade device performance.

BRIEF SUMMARY OF THE INVENTION

The inventor has identified drawbacks in the conventional methods for forming nanowire devices, especially in gate patterning. Embodiments of the present invention provide a method for forming a nanowire device that can provide a good interface between the nanowire and the gate structure.

According to some embodiments of the present invention, a method for forming a semiconductor device may include providing a semiconductor substrate; performing an etch process on the semiconductor substrate to form a fin and a trench on opposite sides of the fin; forming an etch guide layer filling the trench; performing an etch process on the etch guide layer to expose a portion of the fin; performing a first etch process on the etch guide layer to expose a first portion of the fin; selectively etching the exposed portion of the fin to remove a portion of the exposed first portion of the fin adjacent to an upper first surface of the etch guide layer to form a first nanowire extending in a first direction parallel to the upper first surface of the etch guide layer; performing a second etch process on the upper first surface of the etch guide layer to expose a second portion of the fin that is below the first portion of the fin; selectively etching the exposed second portion of the fin to remove a portion of the exposed second portion of the fin adjacent to an upper second surface of the etch guide layer to form a second nanowire extending in the first direction parallel to the upper second surface of the etch guide layer; and forming a gate structure surrounding the first and second nanowires. The first and second nanowires are disposed on the semiconductor substrate in a second direction perpendicular to the first direction.

In one embodiment, selectively etching the exposed the first and second portions of the fin includes performing a plasma dry etching using a chlorine-containing or bromine-containing gas.

In one embodiment, the chlorine-containing gas includes $Cl_2$, and the bromine-containing gas comprises HBr.

In one embodiment, the etch guide layer includes silicon oxide.

In one embodiment, selectively etching the exposed first and second portions of the fin includes providing a $Cl_2$ gas or a HBr gas along with a carrier gas into a plasma reaction chamber at a RF (e.g., microwave) power in a range between 10 W and 5000 W and at a pressure in a range between 0.05 mTorr and 5000 mTorr.

In one embodiment, a flow rate of the $Cl_2$ gas or the HBr gas is in a range between 10 sccm and 2000 sccm, and a flow rate of the carrier gas is in a range between 10 sccm and 2000 sccm.

In one embodiment, the carrier gas includes He, $N_2$, or Ar.

In one embodiment, selectively etching the exposed the first and second portions of the fin further includes providing oxygen into the plasma reaction chamber together with the carrier gas, with a flow rate of oxygen ranging between 100 sccm and 10000 sccm.

In one embodiment, performing the etch process on the semiconductor substrate includes forming a patterned hardmask layer on the semiconductor substrate; and etching the semiconductor substrate using the patterned hardmask layer as a mask to form the fin having a first fin portion, a second fin portion, and a third fin portion, and the trench on opposite sides of the first fin portion. The second and third fin portions are disposed on opposite ends of the first fin portion, and each of the second and third fin portions has a width larger than a width of the first fin portion in a lateral direction.

In one embodiment, the hardmask layer includes a plurality of first material layers and a plurality of second material layers that are stacked alternatively.

In one embodiment, each of the first material layers includes TEOS, and each of the second material layers includes titanium nitride.

In one embodiment, forming the etch guide layer includes depositing the etch guide layer covering the fin and the hardmask layer, planarizing the deposited etch guide layer, and etching the planarized etch guide layer to expose an upper surface of the hardmask layer.

In one embodiment, etching the planarized etch guide layer includes forming a patterned mask layer on the second fin portion and third fin portion covering a portion of the first fin portion adjacent to the second and third fin portions, etching the etch guide layer using the patterned mask layer as a mask to expose a first portion of the first fin portion not covered by the mask layer while retaining a portion of the etch guide layer covered by the mask layer, and removing the mask layer.

In one embodiment, the method may further include, after forming the first and second nanowires and prior to forming the gate structure surrounding the first and second nanowires, performing a third etch process on the upper second surface of the etch guide layer to expose a third portion of the fin below the second nanowire; and selectively etching the exposed third portion of the fin to remove a portion of the exposed third portion of the fin adjacent to an upper third surface of the etch guide layer to form a third nanowire; and forming the gate structure surrounding the first, second, and third nanowires that are formed sequentially in the second direction perpendicular to the semiconductor substrate.

In one embodiment, performing the first, second, and third etch processes on the etch guide layer includes performing a plasma etching process using a fluorine-containing gas.

In one embodiment, the gate structure includes an insulating layer on a bottom and sidewalls of the trench and surrounding the nanowire, a high-k dielectric layer on the insulating layer, and a gate on the high-k dielectric layer.

In one embodiment, forming the gate structure includes forming a first insulating layer covering the semiconductor substrate and surrounding the nanowire, forming a first high-k dielectric layer on the first insulating layer, forming a first gate material layer on the first high-k dielectric layer and filling the trench, planarizing the first gate material layer to expose an upper surface of the first fin portion, an upper surface of the second fin portion, and an upper surface of the third fin portion, forming a second insulating layer on the exposed upper surface of the first fin portion, a second high-k dielectric layer on the second insulating layer, and a second gate material layer on the second high-k dielectric layer and filling the trench, and etching the first and second gate material layers to form a patterned gate.

In one embodiment, the fin includes a source and a drain disposed on opposite ends of the fin, and the method further includes forming a gate contact, a source contact, and a drain contact connecting to the respective gate, source and drain.

In one embodiment, the method may further include, after forming the first, second, and third nanowires and prior to forming the gate structure surrounding the first, second, and third nanowires, subjecting the nanowire to a hydrogen annealing process or an oxygen plasma treatment to round out a cross-sectional shape of the nanowires.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

Figure 1:
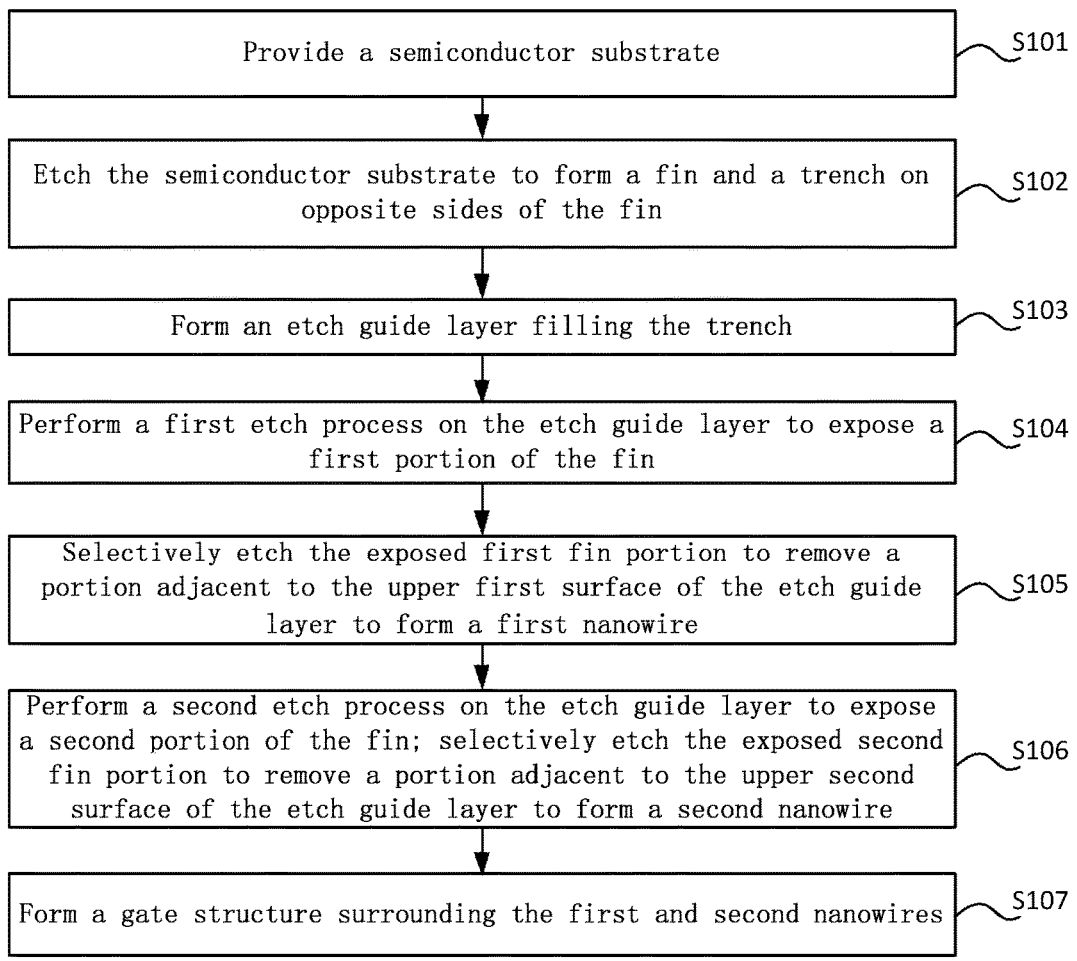
FIG. 1 is a simplified flowchart of a method for manufacturing a semiconductor device according to an embodiment of the present invention.

The present invention will be understood more fully from the detailed description given below and from the accompanying drawings of the preferred embodiments of the invention, which, however, should not be taken to limit the invention to the specific embodiments, but are for explanation and understanding only.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Furthermore, the terminology as used herein is for the purpose of describing example embodiments only and is not intended to be a limitation of the invention. In this respect, as used herein, the term "in" may include "within" and "on", and the terms "a", "an" and "the" may include singular and plural references.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

FIG. 1 is a flowchart of a method for manufacturing a semiconductor device according to an embodiment of the present invention. The method may include the following steps:

S101: providing a semiconductor substrate.

S102: etching the semiconductor substrate to form a fin and a trench on opposite sides of the fin.

S103: forming an etch guide layer filling the trench. The etch guide layer may include silicon dioxide.

S105: etching the etch guide layer to expose a first portion of the fin.

S105: selectively etching the exposed first portion of the fin so that a portion of the exposed first portion of the fin adjacent to an upper first surface of the etch guide layer is removed to form a first nanowire. For example, the selective etching is performed by a plasma dry etching process using a chlorine-containing or bromine containing gas. The chlorine-containing gas may include, e.g., $Cl_2$ (chlorine gas). The bromine-containing gas may include, e.g., HBr (hydrogen bromide) gas.

In one embodiment, the selective etching may be performed by providing a gas such as $Cl_2$ or HBr along with a carrier gas into a plasma reaction chamber, at a pressure ranging from 0.05 mTorr to 5000 mTorr (e.g., 10 mTorr, 200 mTorr, or 1000 mTorr), with a radio frequency (RF) power in the range between 10 W and 5000 W (e.g., 100 W, 500 W, or 1000 W).

In one embodiment, the flow rate of gas $Cl_2$ or HBr may be in the range between 10 sccm and 2000 sccm (e.g., 100 sccm, 500 sccm, or 1000 sccm, etc.). For example, the carrier gas may include He (helium), $N_2$ (nitrogen) or Ar (argon).

In one embodiment, oxygen may be provided into the plasma reaction chamber when $Cl_2$ or HBr gas is provided into the plasma reaction chamber together with the carrier gas. In one embodiment, the flow rate of the oxygen gas may be in the range between 100 sccm and 10,000 sccm, e.g., the flow rate of the oxygen gas may be 200 sccm, 500 sccm, or 1000 sccm.

In one embodiment, the method may further include:

S106: etching the etch guide layer to expose a second portion of the fin, and selectively etching the exposed second portion of the fin so that a portion of the exposed second portion of the fin adjacent to an upper second surface of the etch guide layer is removed to form a second nanowire. In some embodiments, the method may further include repeating the step S106 to form a third nanowire, and a fourth nanowire, etc.

S107: forming a gate structure surrounding the nanowires that are formed top-down in a direction perpendicular to the semiconductor substrate.

The above-described embodiment provides a method for manufacturing a semiconductor device having a cylindrical-gate nanowire. In the embodiment, the nanowire is formed by selectively etching the fin so that a portion of the fin adjacent to the upper surface of the etch guide layer is removed to form a nanowire that can be used as a channel for the semiconductor device, then a gate structure is formed surrounding the nanowire for forming a cylindrical gate nanowire device. The cylindrical-gate nanowire device manufactured by the above-described method can have excellent gate control capability and thermal conductivity characteristics, so that the device may have excellent ability to suppress short-channel effects and high electron mobility, and the size of the device can be further reduced and the performance and reliability of the device can be improved.

In one embodiment, after step S105 and prior to step S107, the method may also include repeating etching the etch guide layer to expose another portion of the fin below the formed nanowires and selectively etching the fin such that the portion of the fin adjacent to the upper surface of the etch guide layer is removed to form more nanowires. In the embodiment, more nanowires may be formed by the above-described steps, so that the semiconductor may have more than two nanowires (e.g., three nanowires all of which can be used as channels). It will be appreciated by those of skill in the art that, according to the above-described steps, it is possible to form a semiconductor device having three or more nanowires, and the scope of the present invention is not limited thereto.

In one embodiment, the step of continuing etching the etch guide layer may be performed by a plasma dry etching process using a fluorine-containing gas. For example, the fluorine-containing gas may include $F_2$ (fluorine gas), $CF_4$ (carbon tetrafluoride), $C_xF_y$ (fluorocarbon), $CHF_3$ (trifluoromethane), $CH_2F_2$ (difluoromethane), or $CH_3F$ (monofluoromethane).

In one embodiment, the plasma dry etching using the fluorine-containing gas may be performed by providing a fluorine-containing gas and a carrier gas into a plasma reaction chamber at a pressure in the range between 0.05 mTorr and 5000 mTorr (e.g., 10 mTorr, 200 mTorr, or 1000 mTorr), with a RF (microwave) power in the range between 10 W and 5000 W (e.g., 100 W, 500 W, or 1000 W).

In one embodiment, the flow rate of fluorine-containing gas may be in the range between 10 sccm and 2000 sccm (e.g., 100 sccm, 500 sccm, or 1000 sccm, etc.). In one embodiment, the carrier gas may include He (helium), $N_2$ (nitrogen) or Ar (argon).

In one embodiment, the gate structure may include an insulator layer on the bottom and sidewalls of the trench and surrounding the nanowire, a high-k dielectric layer on the insulator layer, and a gate on the high-k dielectric layer. The insulator layer may include silicon oxide. The high-k dielectric layer may include, for example, silicon nitride, $Al_2O_3$ (aluminum oxide), $Y_2O_3$ (yttrium oxide), $La_2O_3$ (lanthanum trioxide), $Ta_2O_5$ (tantalum pentoxide), $TiO_2$ (titanium dioxide), $HfO_2$ (hafnium oxide), or $ZrO_2$ (zirconium dioxide). The gate may include polysilicon.

In one embodiment, opposite ends of the fin can be used as a source and drain. In one embodiment, the method may further include forming a gate contact, a source contact and a drain contact connected to the gate, the source and the drain, respectively.

FIGS. 2 to 22 are perspective views illustrating intermediate stages of a structure in a manufacturing method of a semiconductor device according to some embodiments of the present invention. In the manufacturing method shown in FIGS. 2 through 22, a semiconductor device having three nanowires is formed. The manufacturing method of a semiconductor device according to some embodiments of the present invention will be described below with reference to FIGS. 2 to 22.

Figure 2:
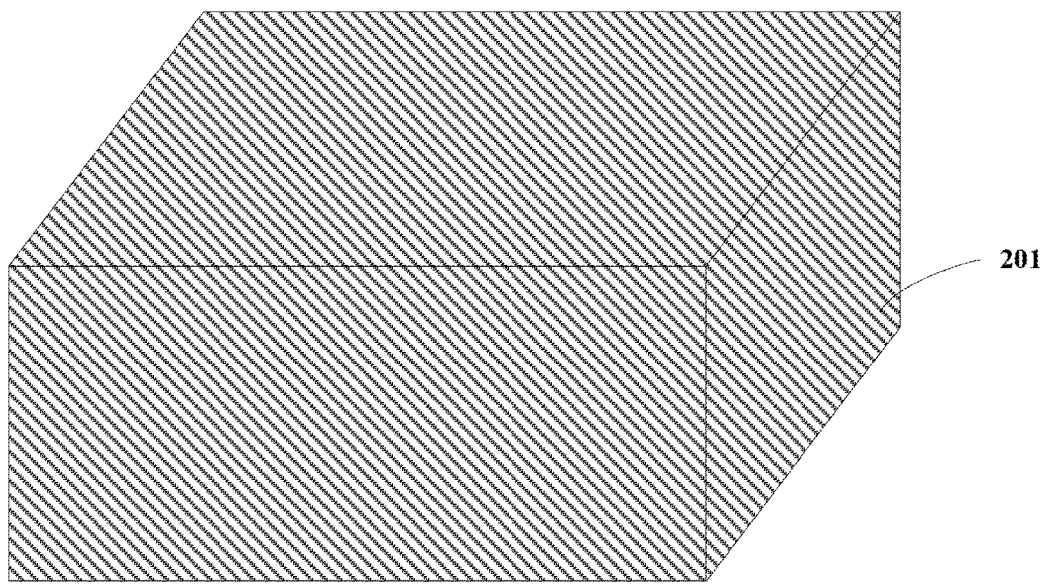
FIGS. 2 to 22 are perspective views illustrating intermediate stages of a structure in a manufacturing method of a semiconductor device according to some embodiments of the present invention.

Referring to FIG. 2, a semiconductor substrate 201 is provided. For example, semiconductor substrate 201 may include silicon. Semiconductor substrate 201 may be an N-type doped or a P-type doped semiconductor substrate.

Next, an etch process is performed on the semiconductor substrate to form a fin and a trench on opposite sides of the fin.

Figure 3:
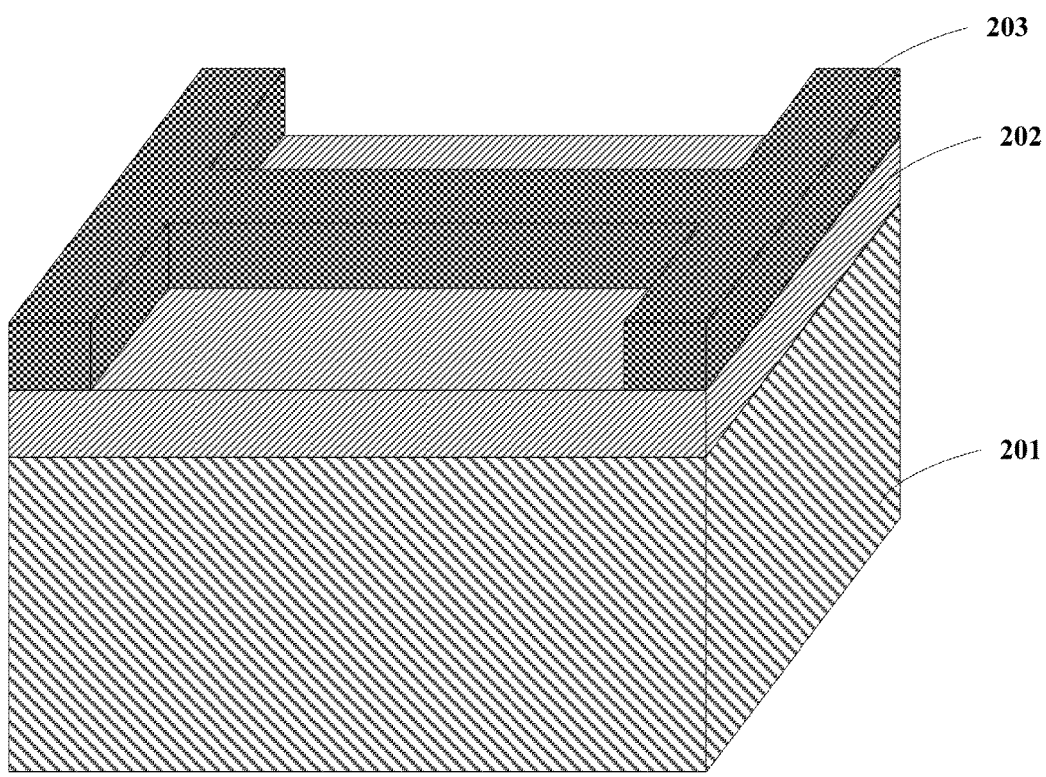
Figure 4:
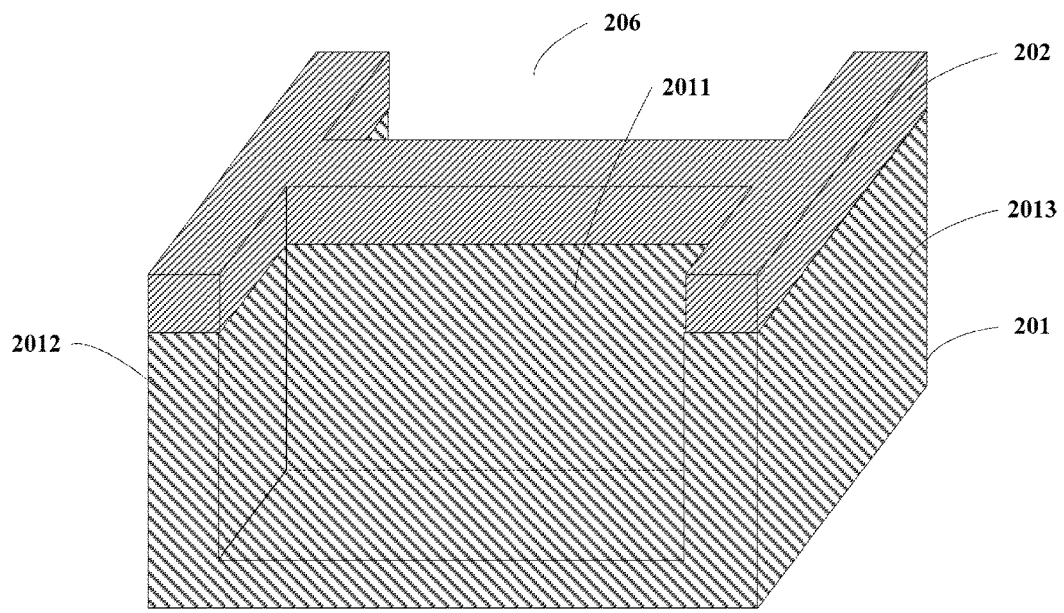

In one embodiment, the etch process to form the fin may include forming a patterned hardmask layer on the semiconductor substrate. Referring to FIG. 3, a hardmask layer 202 is formed on semiconductor substrate 201, and a patterned mask layer 203 is formed on hardmask layer 202. Mask layer 203 may include photoresist and is referred to as a first mask layer). Next, hardmask layer 202 is etched using mask layer 203 as a mask to form the patterned hardmask layer, as shown in FIG. 4.

Next, the etch process to form the fin may further include etching (e.g., using a dry etching process) the semiconductor substrate using hardmask layer 202 as a mask to form the fin. In one embodiment, after forming the fin, the method may further include subjecting the structure shown in FIG. 4 to a wet cleaning treatment using a surface treatment chemical (e.g., EKC).

In one embodiment, the fin may include a first fin portion 2011 disposed in the middle portion of the fin, a second fin portion 2012 and a third fin portion 2013 disposed at opposite ends of the fin. A trench 206 is formed on opposite sides of first fin portion 2012. In one embodiment, the width in the lateral direction (i.e., lateral width) of second fin portion 2012 and third fin portion 2013 is larger than the lateral width of first fin portion 2011. It is noted that, in the embodiments of the present disclosure, the direction along which the first fin portion extends is the longitudinal direction, and the direction perpendicular to the longitudinal direction is the lateral direction.

Figure 23:
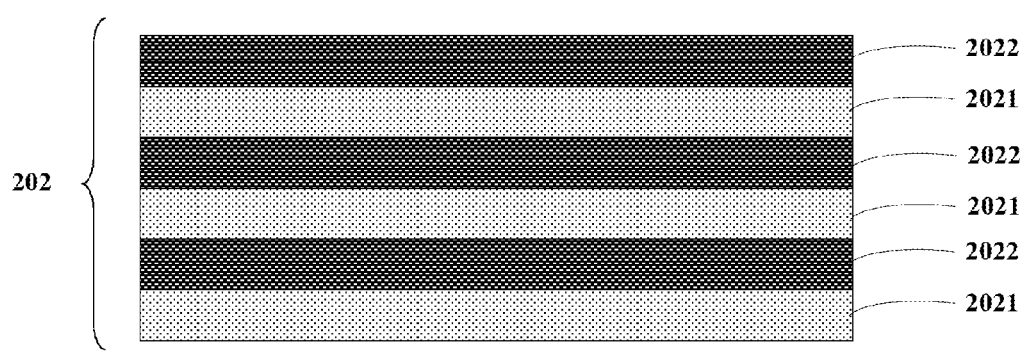
FIG. 23 is a cross-sectional view illustrating a hardmask layer according to an embodiment of the present invention.

In one embodiment, hardmask layer 202 may include a first material layer and a second material layer that are alternatively stacked for blocking different plasma etch processes. FIG. 23 is a cross-sectional view illustrating a hardmask layer according to an embodiment of the present invention. As shown in FIG. 23, hardmask layer 202 may include a multitude of first material layer 2021 and a multitude of second material layer 2022 that are alternatively stacked. Each of first material layer 2021 and second material layer 2022 may be used to block different plasma etch processes. In an exemplary embodiment, first material layer 2021 may be used to block a plasma dry etching using a chlorine-containing or bromine-containing gas (e.g., $Cl_2$ or HBr gas) in a subsequent step. The first material layer may include TEOS (tetraethyl orthosilicate). In an exemplary embodiment, second material layer 2022 may be used to block plasma dry etching using a fluorine-containing gas in a subsequent step. The second material layer may include titanium nitride.

It is noted that the number of first and second material layers can be any integer number. In the example shown in FIG. 23, three first material layers 2021 and three second material layers 2022 are used. But it is understood that the number is arbitrarily chosen for describing the example embodiment and should not be limiting. In other words, more or fewer layers of the first material layer and the second material layer may be used according to embodiments of the present invention.

Next, an etch guide layer is formed filling the trench.

Figure 5:
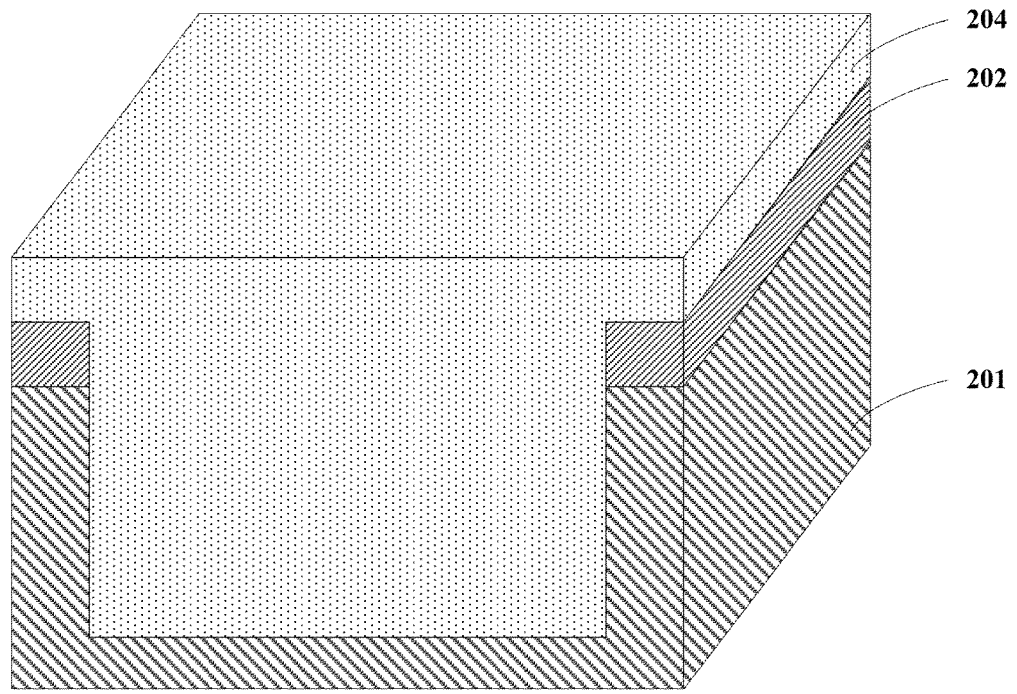

In one embodiment, referring to FIG. 5, forming the etch guide layer may include depositing (e.g., using a flowable chemical vapor deposition process) etch guide layer 204 covering the fin and the hardmask layer and filling trench 206. The etch guide layer may include silicon oxide. Thereafter, a planarization (e.g., by a chemical mechanical polishing) process is performed on etch guide layer 204.

Figure 6:
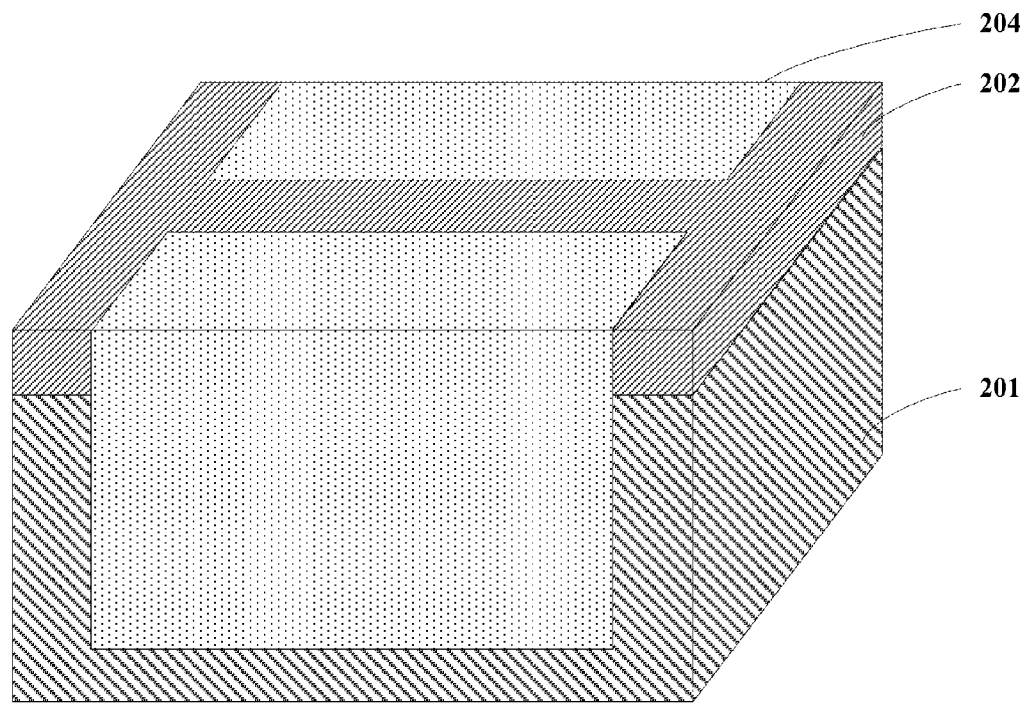

Next, forming the etch guide layer filling the trench may further include etching the etch guide layer to expose an upper surface of hardmask layer 202, as shown in FIG. 6.

Next, etching the etch guide layer to expose a portion of the fin.

Figure 7:
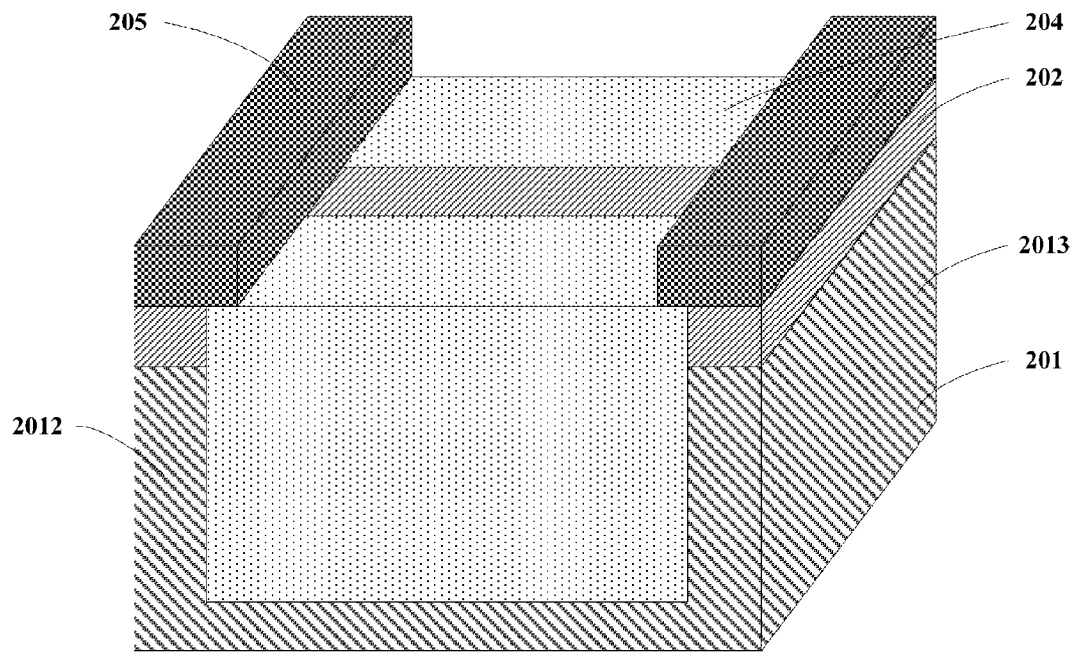

In one embodiment, etching the etch guide layer to expose a portion of the fin may include forming a patterned mask layer 205 on the portion of hardmask layer 202 above second fin portion 2012 and third fin portion 2013. Mask layer 205 may be referred to as a second mask layer and including photoresist. Referring to FIG. 7, mask layer 205 also covers a portion of etch guide layer 204 adjacent to second fin portion 2012 and third fin portion 2013.

Figure 8:
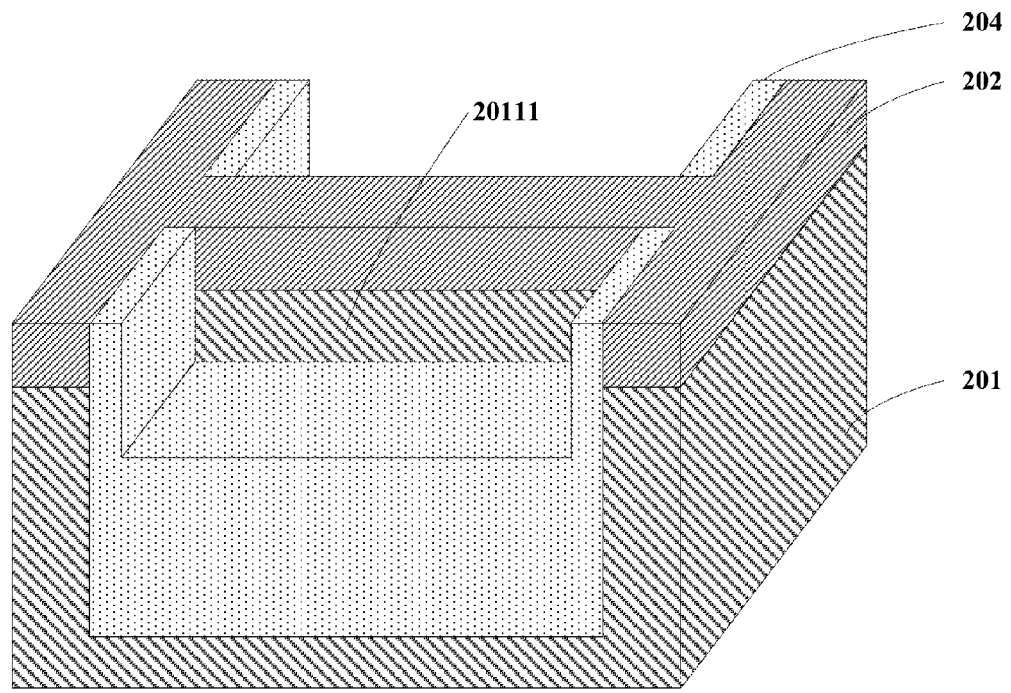

Next, referring to FIG. 8, etching the etch guide layer to expose a portion of the fin may further include etching (e.g., using a dry etching process) etch guide layer 204 to expose a first portion 20111 of first fin portion 2011 using mask layer 205 as a mask while retaining a portion of etch guide layer 204 that is covered by mask layer 205, and removing mask layer 205.

In one embodiment, after exposing the first portion of the first fin portion, the method may further include subjecting the structure shown in FIG. 8 to a wet cleaning process using a surface treatment chemical (e.g., EKC).

Figure 9:
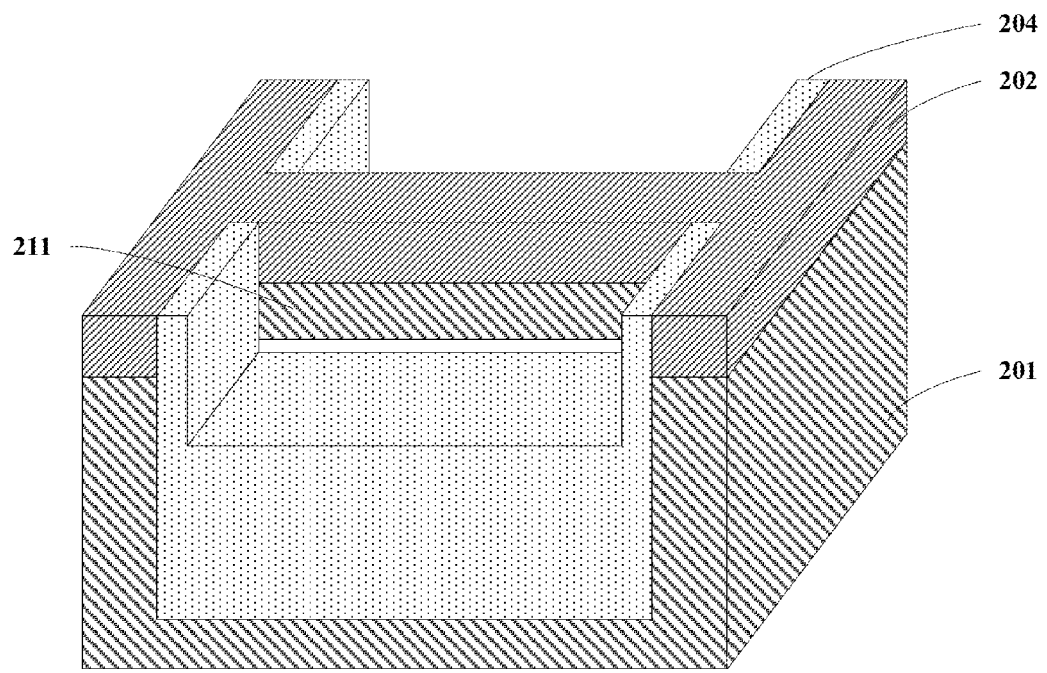

Next, referring to FIG. 9, first portion 20111 is selectively etched so that a portion of first portion 20111 adjacent to the upper surface of etch guide layer 204 is removed to form a first nanowire 211.

In one embodiment of the present invention, the selective etching may be performed using electron cyclotron resonance (ECR) plasma etching techniques. For example, a $Cl_2$ or HBr gas may be provided together with oxygen and a carrier gas into a plasma reaction chamber, and the selective etching may be performed at a pressure in the range between 0.05 mTorr and 5000 mTorr and a RF (microwave) power in the range between 10 W and 5000 W.

The principle of selective etching is described below:

In the plasma etching process, due to the presence of an electric field caused by the ion sheath (concentration of ions), positively charged ions may partially accumulate under the action of the electric field on the bottom of the exposed portion (e.g., the first portion) of the fin adjacent to the etch guide layer. When the positively charged ions move to the etch guide layer, they will scatter to the bottom of the exposed portion (first portion 20111) of the fin due to the repulsive action of the accumulated positively charged ions, so that the bottom of the exposed portion is etched. However, since the etching is highly selective to the etch guide layer (e.g., silicon oxide) and the fin (silicon), the etching does not etch the etch guide layer (e.g., silicon oxide). As the etch time increases, the side of the bottom of the exposed portion of the fin will be etched through, i.e., the side of the silicon bottom is etched through and the remainder of the exposed portion forms a nanowire.

In one embodiment, after the nanowire is formed, the method may further include subjecting the structure shown in FIG. 9 to a wet cleaning process using a surface treatment chemical (e.g., EKC).

Figure 10:
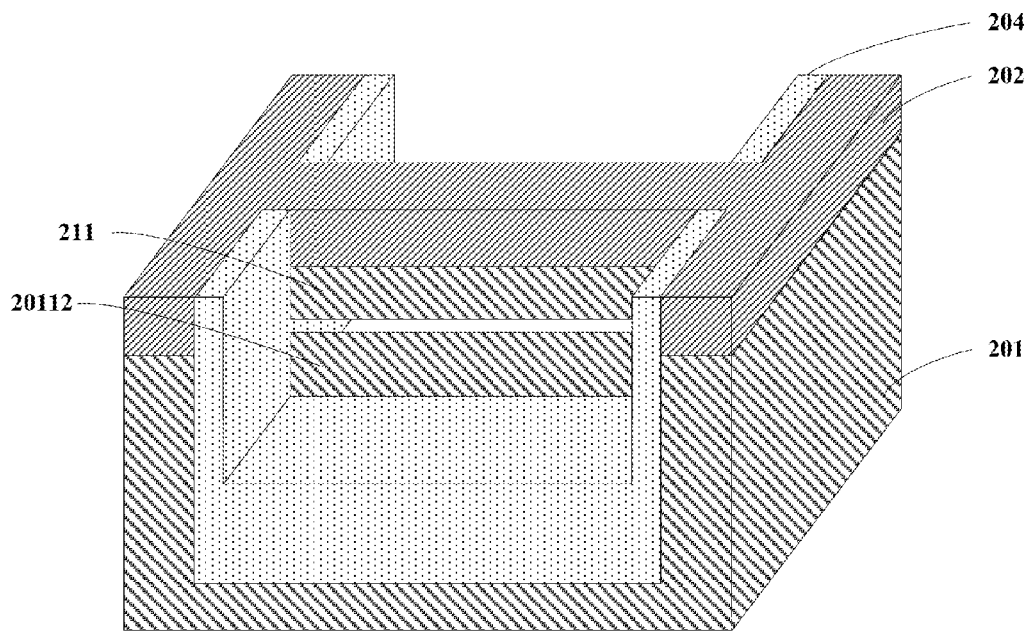

Next, referring to FIG. 10, an etching process is performed on etch guide layer 204 using a plasma dry etching process with a fluorine-containing gas to expose a second portion 20112 of the fin below first nanowire 211. In one embodiment, after exposing second portion 20112 of the fin, the method may further include subjecting the structure shown in FIG. 10 to a wet cleaning process using a surface treatment chemical (e.g., EKC).

Figure 11:
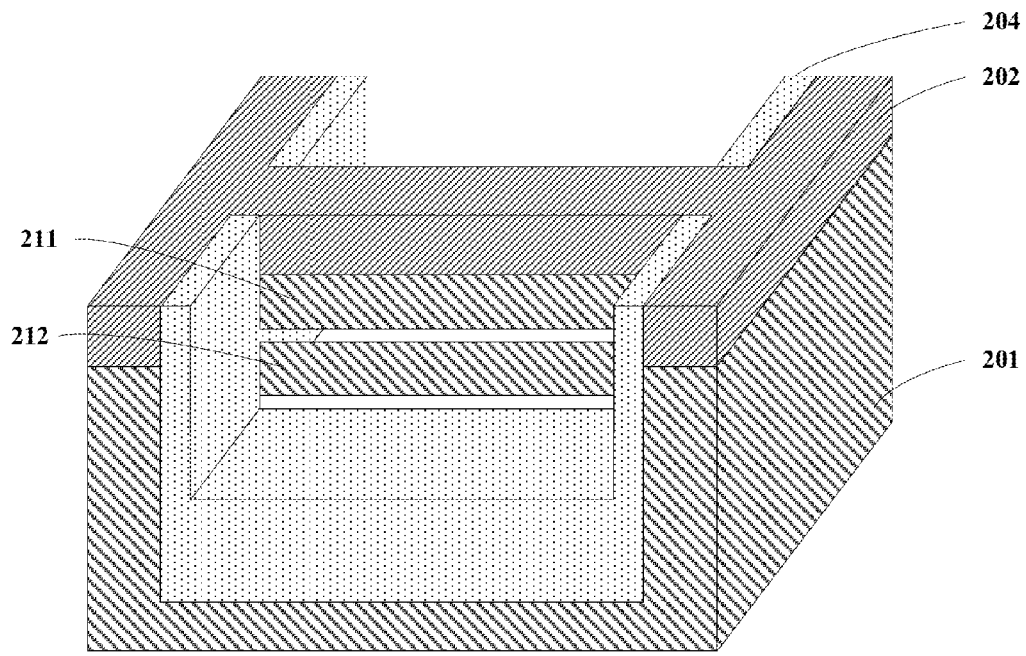

Next, referring to FIG. 11, second portion 20112 is selectively etched such that the portion of second portion 20112 adjacent to the upper surface of etch guide layer 204 is removed to form a second nanowire 212. The selective etching process for this step is similar to the selective etching process used to form the first nanowire and will not be repeated herein for the sake of brevity. In one embodiment, after the second nanowire is formed, the method may further include subjecting the structure shown in FIG. 11 to a wet cleaning process using a surface treatment chemical (e.g., EKC).

Figure 12:
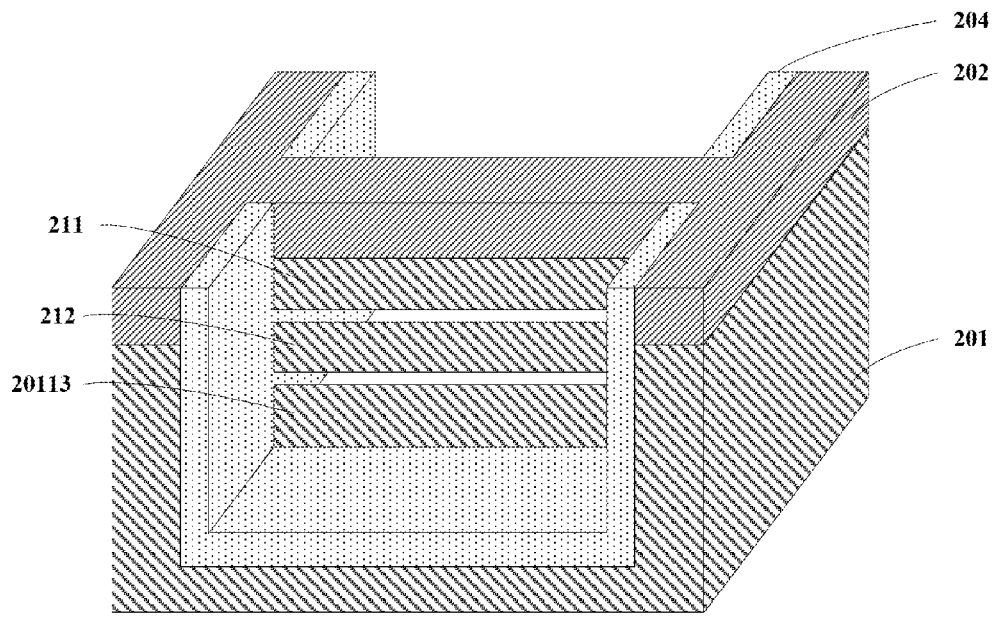

Next, referring to FIG. 12, an etch process is performed on etch guide layer 204 using a plasma dry etching process with a fluorine-containing gas to expose a third portion 20113 of the fin below second nanowire 212. In one embodiment, after exposing third portion 20113 of the fin, the method may further include subjecting the structure shown in FIG. 12 to a wet cleaning process using a surface treatment chemical (e.g., EKC).

Figure 13:
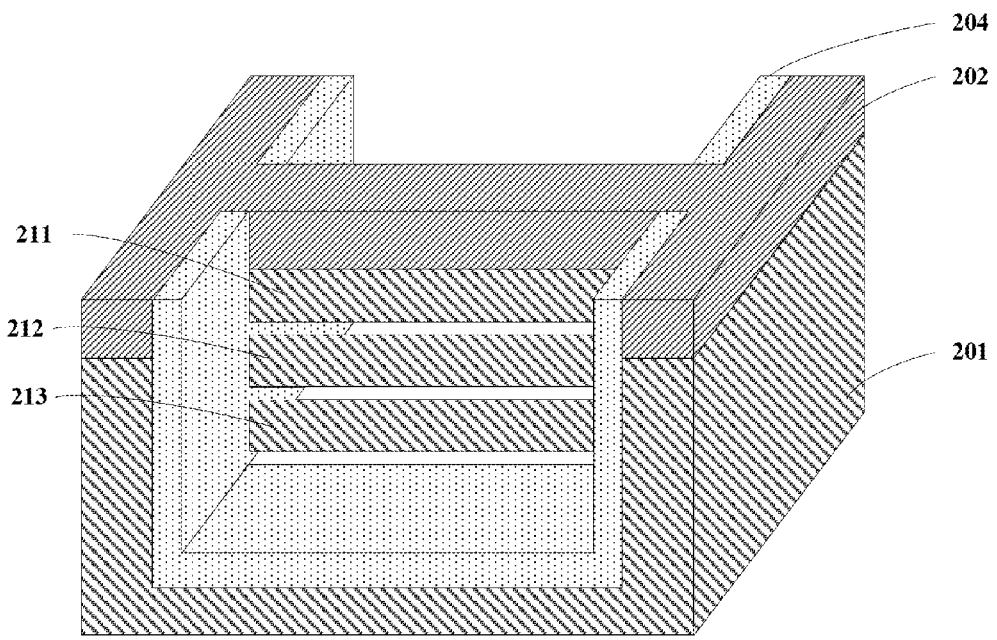

Next, referring to FIG. 13, third portion 20113 is selectively etched such that the portion of third portion 20113 adjacent to the upper surface of etch guide layer 204 is removed to form a third nanowire 213. The selective etching process for this step is similar to the selective etching process used to form the first nanowire, and it will not be repeated herein for the sake of brevity. In one embodiment, after the third nanowire is formed, the method may further include subjecting the structure shown in FIG. 13 to a wet cleaning process using a surface treatment chemical (e.g., EKC).

In one embodiment, after the nanowires are formed and prior to forming a gate structure, the method may further include subjecting the nanowires to a hydrogen annealing or an oxygen plasma treatment so that the nanowires have a rounded cross-sectional shape. For example, first nanowire 211, second nanowire 212, and third nanowire 213 shown in FIG. 13 are subjected to a hydrogen annealing treatment or an oxygen plasma treatment (e.g., plasma treatment with oxygen gas), so that the sides of the nanowires are rounded. In an exemplary embodiment, the nanowires have a cylindrical shape, which facilitates the formation of a circumferentially enclosed gate structure in subsequent steps that improve gate control capability. In one embodiment, the hydrogen annealing is performed at a temperature in the range between 300° C. and 1000° C. (e.g., 500° C.).

Next, a gate structure is formed surrounding the nanowires.

Figure 14:
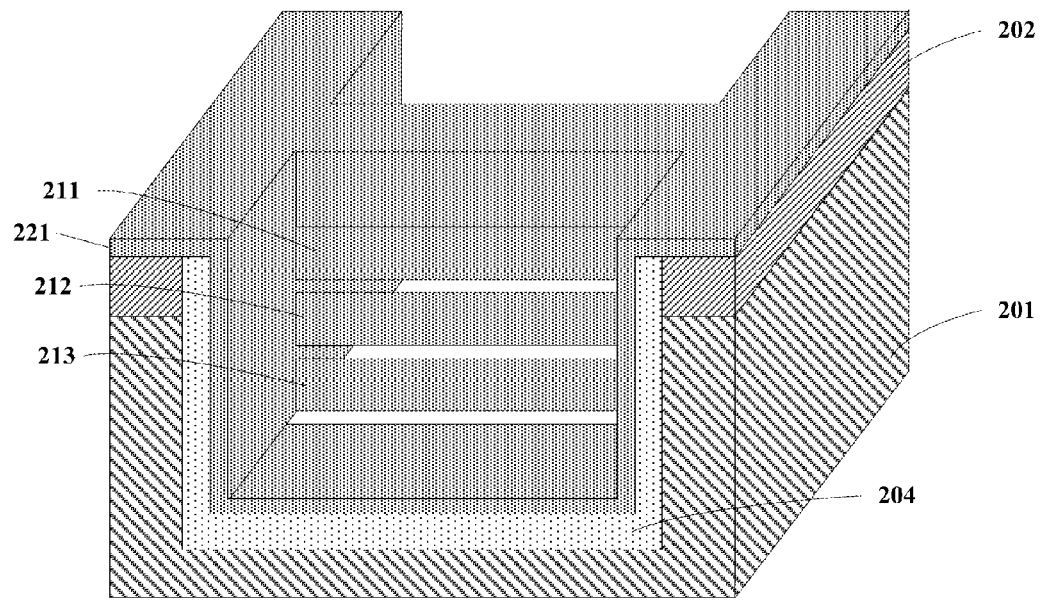

In one embodiment, the gate structure may be formed using the following steps:

Referring to FIG. 14, an insulator layer 221 is formed (e.g., using a deposition process) covering the semiconductor substrate and surrounding the nanowires (e.g., surrounding first nanowire 211, second nanowire 212, and third nanowire 213). The insulator layer may include silicon oxide. In one embodiment, the insulator layer may be subjected to a heat treatment.

Figure 15:
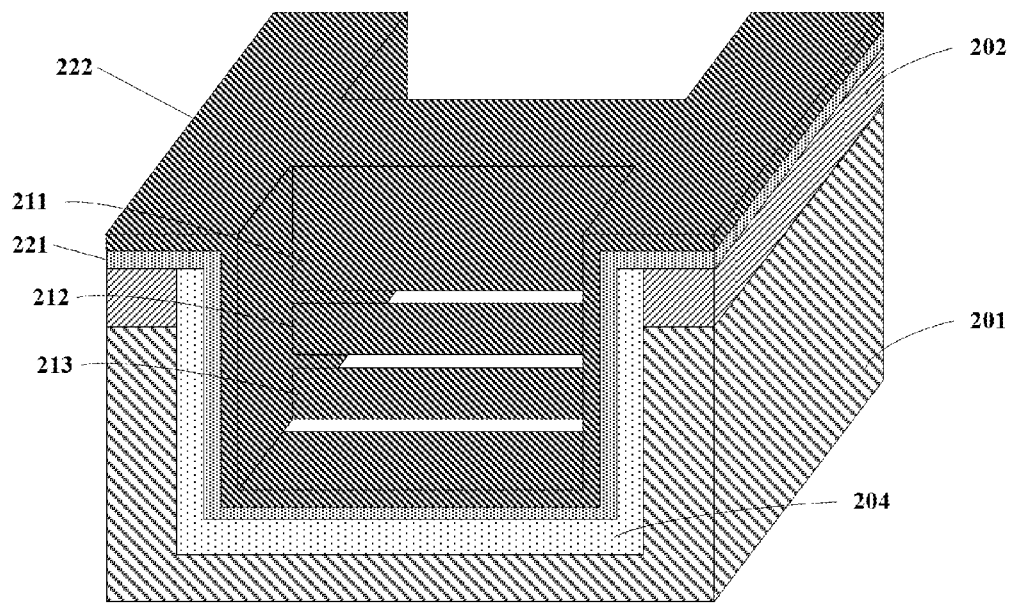

Next, referring to FIG. 15, a high-k dielectric layer 222 is formed (e.g., using an atomic layer deposition process) on insulator layer 221.

Figure 16:
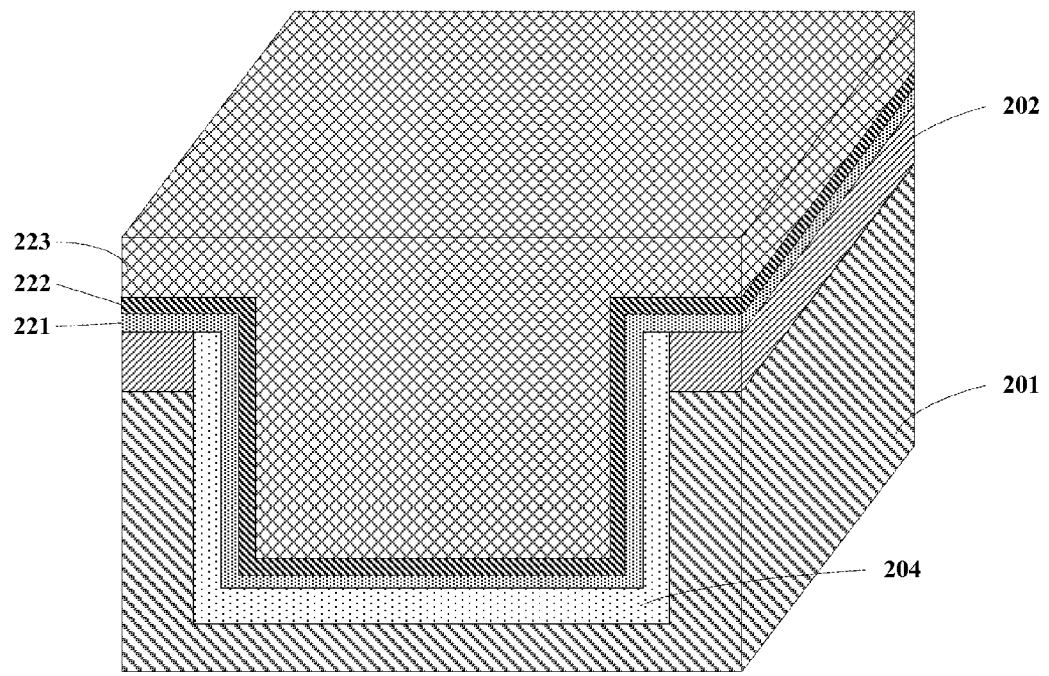

Next, referring to FIG. 16, a gate material layer 223 is formed (e.g., using a flowable chemical vapor deposition process) filling the trench. The gate material layer may include polysilicon doped with an N-type impurity (e.g., phosphorous) or a P-type impurity (e.g., boron).

Figure 17:
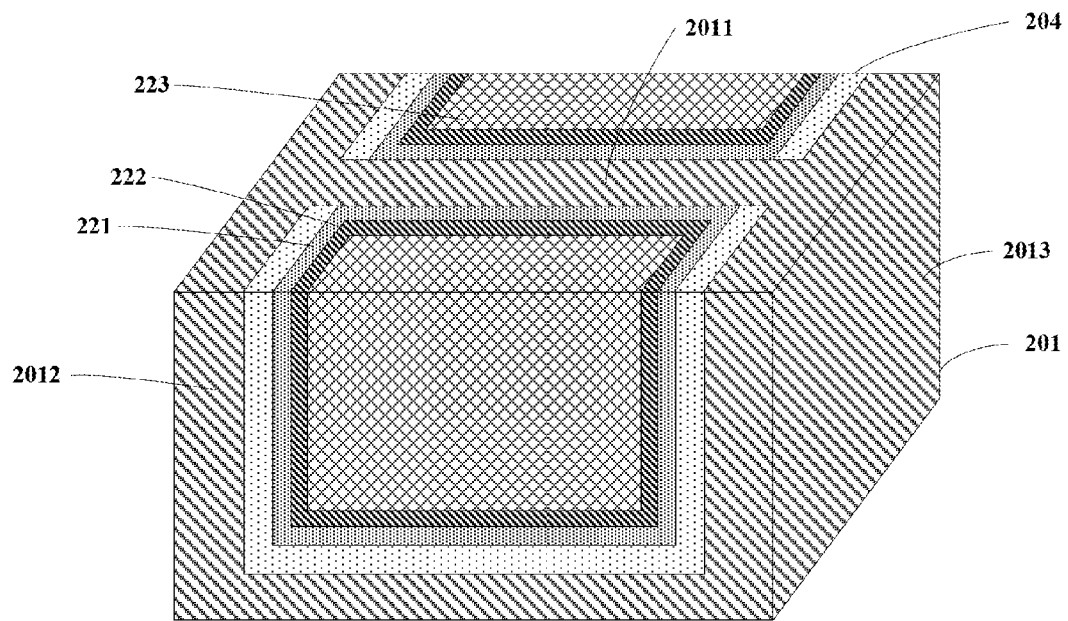

Next, a planarization process is performed on the structure shown in FIG. 16 to expose an upper surface of first portion 2011, second portion 2012 and third portion 2013 of the fin, as shown in FIG. 17.

Figure 18:
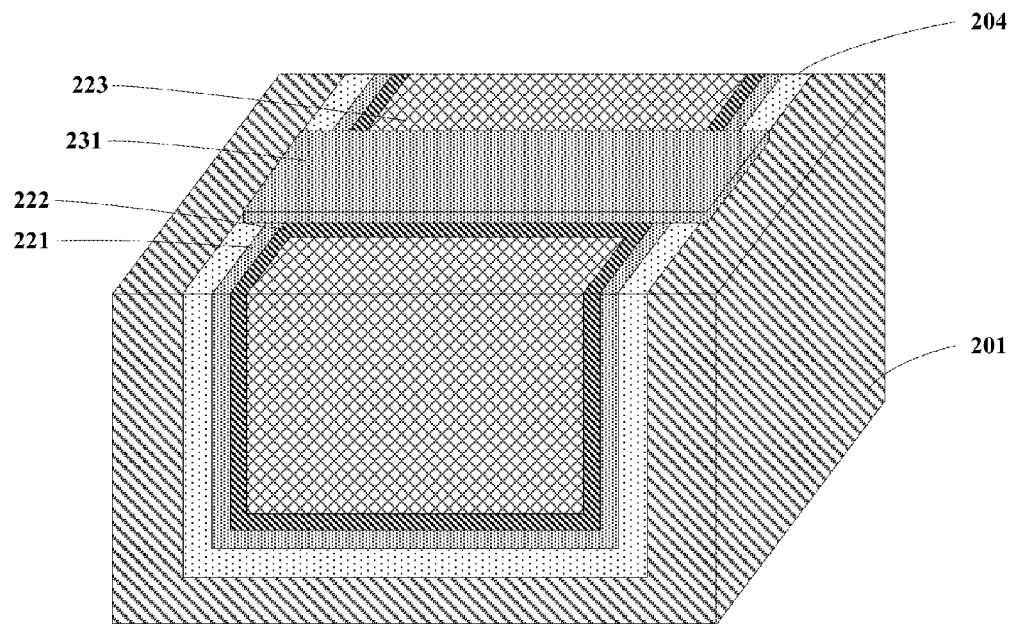
Figure 19:
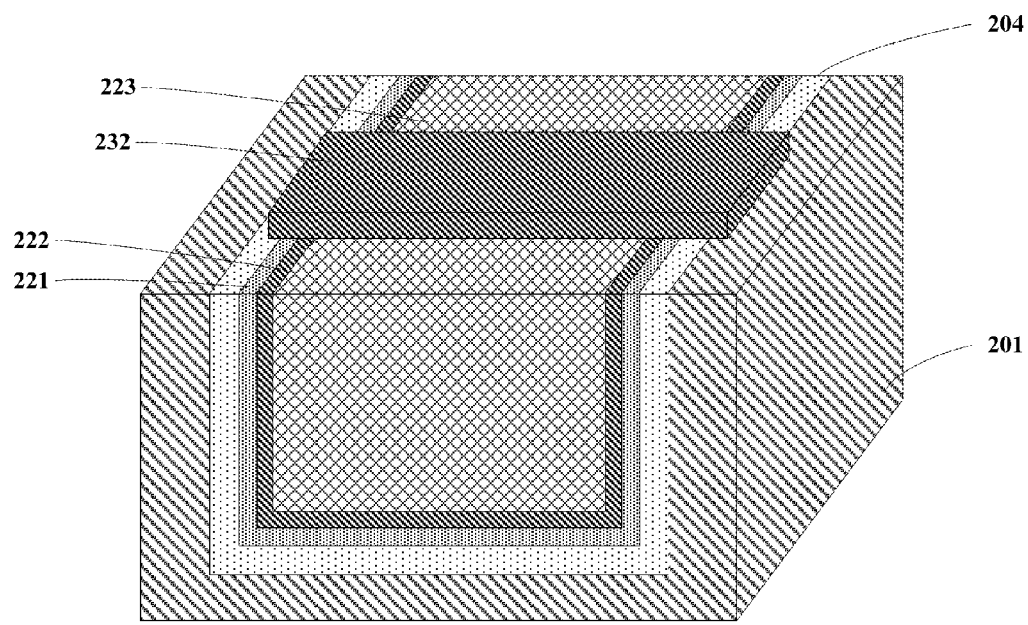
Figure 20:
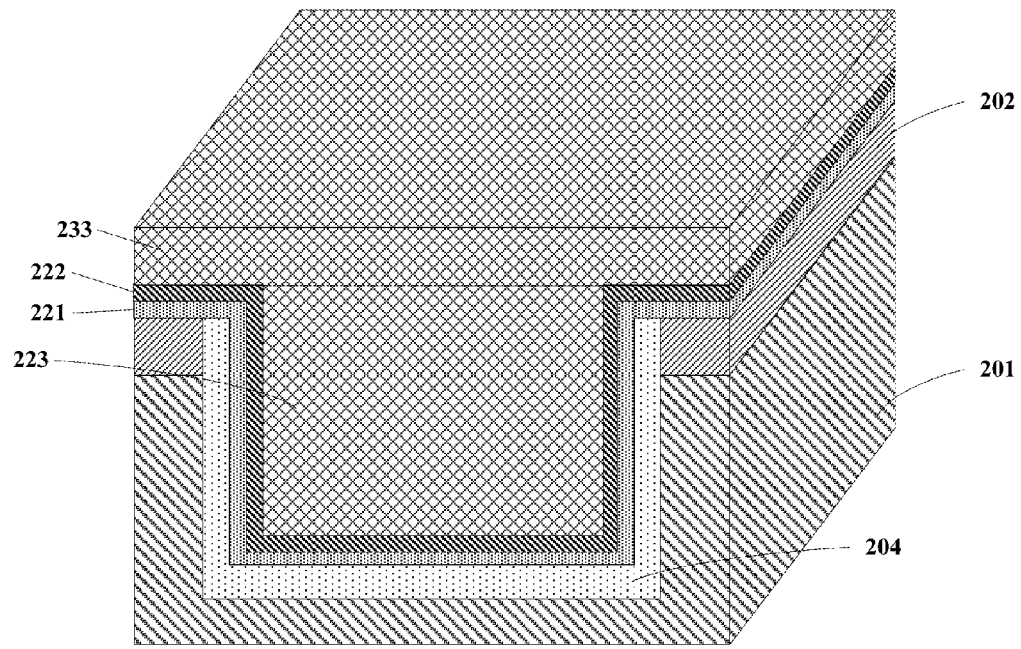

Next, an insulating layer, a high-k dielectric layer and a gate material layer are successively formed to cover the upper surface of first fin portion 2011, second fin portion 2012 and third fin portion 2013 of the fin. Referring to FIG. 18, an insulating layer 231 is formed on first fin portion 2011. Insulating layer 231 may have the same material as that of insulating layer 221. Thereafter, referring to FIG. 19, a high-k dielectric layer 232 is formed on insulating layer 231. High-k dielectric layer 232 may have the same material as that of high-k dielectric layer 222. Thereafter, referring to FIG. 20, a gate material layer 233 is formed on high-k dielectric layer 232. Gate material layer 233 may have the same material as that of gate material layer 223.

For the sake of convenience in explanation, in the following embodiment, insulator layer 221 and insulator layer 231 are collectively referred to as insulator layer 221, high-k dielectric layer 222 and high-k dielectric layer 232 are collectively referred to as high-k dielectric layer 222, and gate material layer 223 and gate material layer 233 are collectively referred to as gate material layer 223.

Figure 21:
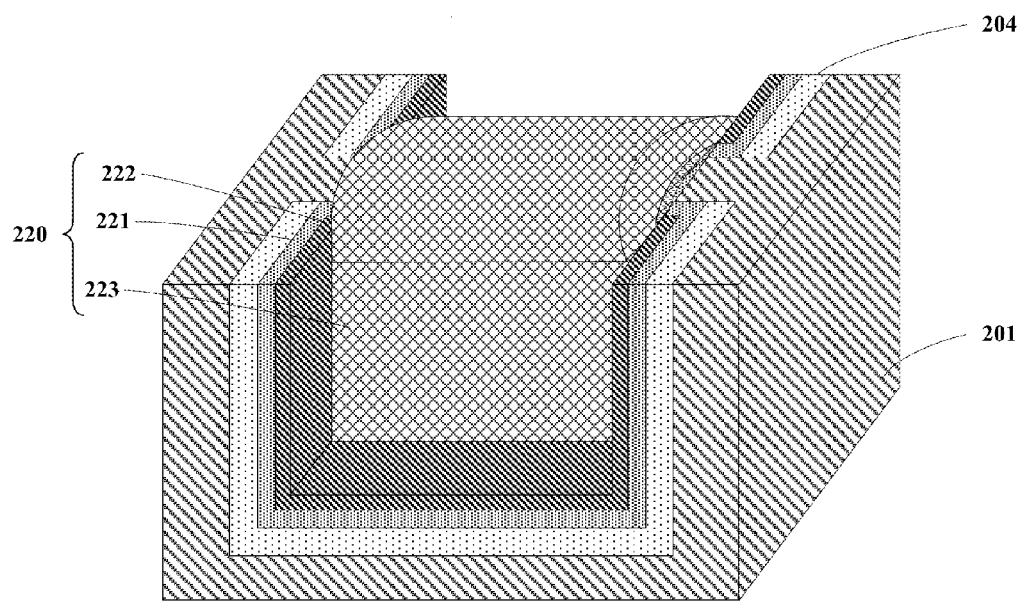

Next, referring to FIG. 21, an etch process (e.g., using a photolithography and dry etching process) is performed on gate material layer 223 to form a patterned gate structure 220. Referring to FIG. 21, gate structure 220 may include an insulating layer 221 on the bottom and sidewalls of the trench and surrounding the nanowires, a high-k dielectric layer 222 on insulating layer 221, and a gate 223 on high-k dielectric layer 222. In one embodiment, after forming the gate, the method may also include performing a wet cleaning process on the structure shown in FIG. 21.

In one embodiment, the two opposite ends of the fin may be used as a source and a drain. In one exemplary embodiment, second fin portion 2012 may be used as the source, and third fin portion 2013 may be used as the drain.

Figure 22:
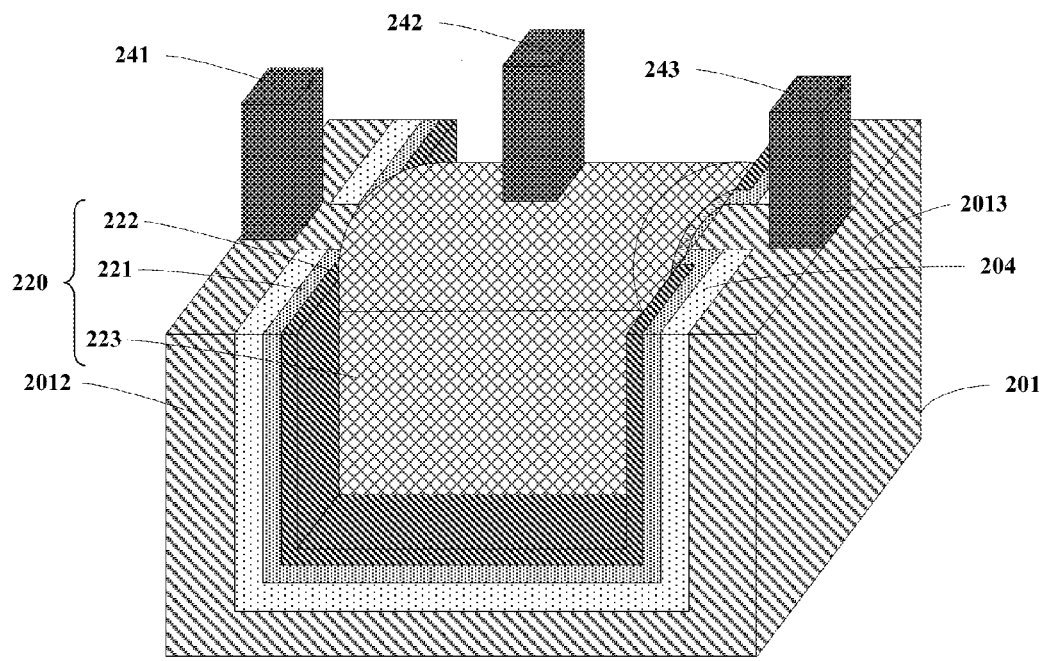

Next, referring to FIG. 22, the method may further include forming a gate contact 242, a source contact 241 and a drain contact 243 that are connected to the gate, the source and the drain, respectively. Gate contact 242, source contact 241, and drain contact 243 may include a metal such as copper or tungsten.

Thus, embodiments of the present invention provide a method of manufacturing a semiconductor device. In the embodiments described above, a cylindrical nanowire device having three nanowires may be formed using a top-down approach. According to the method of the present invention, any number of nanowires (e.g., more or fewer than three nanowires) can be obtained, making the manufacturing process more readily and easily to be implemented.

The thus manufactured semiconductor device has a good gate control capability and heat conduction characteristics, and good ability to suppress short-channel effects and increase high electron mobility, thereby further reducing the device size and improving the device performance and reliability.

Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor substrate;
   forming a patterned hardmask layer on the semiconductor substrate;
   etching the semiconductor substrate using the patterned hardmask layer as a mask to form a fin having a first fin portion extending in a first direction, a second fin portion and a third fin portion each extending in a second direction perpendicular to the first direction, and a trench on opposite sides of the first fin portion, wherein the second and third fin portions are disposed on opposite ends of the first fin portion, and each of the second and third fin portions has a width larger than a width of the first fin portion in the second direction;
   forming an etch guide layer filling the trench;
   performing a first etch process on the etch guide layer to expose a first portion of the fin;

selectively etching the exposed portion of the fin to remove a portion of the exposed first portion of the fin adjacent to an upper first surface of the etch guide layer to form a first nanowire extending in a first direction parallel to the upper first surface of the etch guide layer;

performing a second etch process on the upper first surface of the etch guide layer to expose a second portion of the fin that is below the first portion of the fin;

selectively etching the exposed second portion of the fin to remove a portion of the exposed second portion of the fin adjacent to an upper second surface of the etch guide layer to form a second nanowire extending in the first direction parallel to the upper second surface of the etch guide layer; and forming a gate structure surrounding the first and second nanowires, wherein the first and second nanowires are disposed on the semiconductor substrate in a second direction perpendicular to the first direction, wherein forming the etch guide layer comprises:

depositing the etch guide layer covering the fin and the hardmask layer;

planarizing the deposited etch guide layer; and etching the planarized etch guide layer to expose an upper surface of the hardmask layer.

2. The method of claim 1, wherein selectively etching the exposed first portion and the second portion of the fin comprises performing a plasma dry etching using a chlorine-containing or bromine-containing gas.

3. The method of claim 2, wherein the chlorine-containing gas comprises $Cl_2$, and the bromine-containing gas comprises HBr.

4. The method of claim 2, wherein the etch guide layer comprises silicon oxide.

5. The method of claim 4, wherein selectively etching the exposed first portion and the second portion of the fin comprises providing a $Cl_2$ gas or a HBr gas along with a carrier gas into a plasma reaction chamber at a RF power in a range between 10 W and 5000 W and a pressure in a range between 0.05 mTorr and 5000 mTorr.

6. The method of claim 5, wherein a flow rate of the $Cl_2$ gas or the HBr gas is in a range between 10 sccm and 2000 sccm, and a flow rate of the carrier gas is in a range between 10 sccm and 2000 sccm.

7. The method of claim 5, wherein the carrier gas comprises He, $N_2$, or Ar.

8. The method of claim 5, wherein selectively etching the exposed first portion and the second portion of the fin further comprises providing oxygen into the plasma reaction chamber together with the carrier gas, with a flow rate of oxygen ranging between 100 sccm and 10000 sccm.

9. The method of claim 1, wherein the hardmask layer comprises a plurality of first material layers and a plurality of second material layers that are stacked alternatively.

10. The method of claim 9, wherein the first material layers each comprise TEOS; and the second material layers each comprise titanium nitride.

11. The method of claim 1, wherein etching the planarized etch guide layer comprises:

forming a patterned mask layer on the second fin portion and third fin portion covering a portion of the first fin portion adjacent to the second and third fin portions;

etching the etch guide layer using the patterned mask layer as a mask to expose a first portion of the first fin portion not covered by the mask layer while retaining a portion of the etch guide layer covered by the mask layer; and removing the mask layer.

12. The method of claim 11, further comprising, after forming the first and second nanowires and prior to forming the gate structure surrounding the first and second nanowires:

performing a third etch process on the upper second surface of the etch guide layer to expose a third portion of the fin below the second nanowire; and selectively etching the exposed third portion of the fin to remove a portion of the exposed third portion of the fin adjacent to an upper third surface of the etch guide layer to form a third nanowire; and forming the gate structure surrounding the first, second, and third nanowires that are formed sequentially in the second direction perpendicular to the semiconductor substrate.

13. The method of claim 12, wherein performing the first, second, and third etch processes on the etch guide layer comprises performing a plasma etching process using a fluorine-containing gas.

14. The method of claim 12, further comprising, after forming the first, second, and third nanowires and prior to forming the gate structure surrounding the first, second, and third nanowires:

subjecting the nanowires to a hydrogen annealing process or an oxygen plasma treatment to round out a cross-sectional shape of the nanowires.

15. A method for manufacturing a semiconductor device, the method comprising:

providing a semiconductor substrate;

forming a patterned hardmask layer on the semiconductor substrate;

etching the semiconductor substrate using the patterned hardmask layer as a mask to form a fin having a first fin portion extending in a first direction, a second fin portion and a third fin portion each extending in a second direction perpendicular to the first direction, and a trench on opposite sides of the first fin portion, wherein the second and third fin portions are disposed on opposite ends of the first fin portion, and each of the second and third fin portions has a width larger than a width of the first fin portion in the second direction;

forming an etch guide layer filling the trench;

performing a first etch process on the etch guide layer to expose a first portion of the fin;

selectively etching the exposed portion of the fin to remove a portion of the exposed first portion of the fin adjacent to an upper first surface of the etch guide layer to form a first nanowire extending in a first direction parallel to the upper first surface of the etch guide layer;

performing a second etch process on the upper first surface of the etch guide layer to expose a second portion of the fin that is below the first portion of the fin;

selectively etching the exposed second portion of the fin to remove a portion of the exposed second portion of the fin adjacent to an upper second surface of the etch guide layer to form a second nanowire extending in the first direction parallel to the upper second surface of the etch guide layer; and forming a gate structure surrounding the first and second nanowires, wherein the first and second nanowires are disposed on the semiconductor substrate in a second direction perpendicular to the first direction, wherein the gate structure comprises:

an insulating layer on a bottom and sidewalls of the trench and surrounding the nanowires;

a high-k dielectric layer on the insulating layer; and a gate on the high-k dielectric layer, and wherein forming the gate structure comprises:

forming a first insulating layer covering the semiconductor substrate and surrounding the nanowires;

forming a first high-k dielectric layer on the first insulating layer;

forming a first gate material layer on the first high-k dielectric layer and filling the trench;

planarizing the first gate material layer to expose an upper surface of the first fin portion, an upper surface of the second fin portion, and an upper surface of the third fin portion;

forming a second insulating layer on the exposed upper surface of the first fin portion, a second high-k dielectric layer on the second insulating layer, and a second gate material layer on the second high-k dielectric layer and filling the trench; and etching the first and second gate material layers to form a patterned gate.

16. The method of claim 15, wherein the fin comprises a source and a drain disposed on opposite ends of the fin, the method further comprising:

forming a gate contact, a source contact, and a drain contact connecting to the respective gate, source and drain.

\* \* \* \* \*